United States Patent
Peng et al.

(10) Patent No.: US 9,438,228 B2
(45) Date of Patent: Sep. 6, 2016

(54) HIGH EFFICIENCY GATE DRIVE CIRCUIT FOR POWER TRANSISTORS

(71) Applicants: Board of Trustees of Michigan State University, East Lansing, MI (US); AISIN AW CO. LTD., Anjo, Aichi (JP)

(72) Inventors: Fang Zheng Peng, Okemos, MI (US); Junming Zhang, Hangzhou (CN); Zhiqian Chen, Brighton (GB)

(73) Assignees: Board of Trustees of Michigan State University, East Lansing, MI (US); AISIN AW CO. LTD., Anjo (JP)

(*) Notice: Subject to any disclaimer, the term of this patent is extended or adjusted under 35 U.S.C. 154(b) by 8 days.

(21) Appl. No.: 14/384,569

(22) PCT Filed: Mar. 11, 2013

(86) PCT No.: PCT/US2013/030134
§ 371 (c)(1),
(2) Date: Sep. 11, 2014

(87) PCT Pub. No.: WO2013/138219
PCT Pub. Date: Sep. 19, 2013

(65) Prior Publication Data
US 2015/0028923 A1   Jan. 29, 2015

Related U.S. Application Data

(60) Provisional application No. 61/609,393, filed on Mar. 12, 2012.

(51) Int. Cl.
| H03B 1/00 | (2006.01) |
| H03K 3/00 | (2006.01) |
| H03K 17/60 | (2006.01) |
| H03K 17/16 | (2006.01) |
| H03K 17/082 | (2006.01) |

(52) U.S. Cl.
CPC .......... *H03K 17/60* (2013.01); *H03K 17/0826* (2013.01); *H03K 17/166* (2013.01); *H03K 17/168* (2013.01)

(58) Field of Classification Search
CPC .............. H03K 17/04126; H03K 17/063; H03K 2217/0036; H03K 17/601; H03K 17/0826
USPC .................................. 327/108–112
See application file for complete search history.

(56) References Cited

U.S. PATENT DOCUMENTS

| 5,986,484 A | 11/1999 | Kimata |
| 6,127,746 A | 10/2000 | Clemente |
| 7,843,246 B2* | 11/2010 | Ozalevli ........... H03K 5/08 327/110 |
| 2010/0148830 A1 | 6/2010 | Nilson et al. |
| 2014/0368240 A1* | 12/2014 | Shelton ........ H03K 17/0822 327/109 |

FOREIGN PATENT DOCUMENTS

| EP | 0817381 A2 | 1/1998 |
| EP | 2197111 A1 | 6/2010 |
| EP | 2418776 A1 | 2/2012 |
| GB | 2318467 A | 4/1998 |

OTHER PUBLICATIONS

Shihong Park et al: "Flexible dv/dt and di/dt control method for insulated gate power switches", Conference Record of the 2001 IEEE Industry Applications Conference. 36th IAS Annual Meeting. Chigago, IL, Sept. 30-Oct. 4, 2001; [Conference Record of the IEEE Industry Applications Conference. IAS Annual Meeting], New York, NY: IEEE, US, Sep. 30, 2001, p. 1038, XP032142858, DOI: 1-,11-0/IAS.2001.955592 ISBN: 978-0-7803-7114-9.

* cited by examiner

*Primary Examiner* — Lincoln Donovan
*Assistant Examiner* — Diana J Cheng
(74) *Attorney, Agent, or Firm* — Harness, Dickey & Pierce, P.L.C.

(57) ABSTRACT

An improved gate drive circuit is provided for a power device, such as a transistor. The gate driver circuit may include: a current control circuit; a first secondary current source that is used to control the switching transient during turn off of the power transistor and a second secondary current source that is used to control the switching transient during turn on of the power transistor. In operation, the current control circuit operates, during turn on of the power transistor, to source a gate drive current to a control node of the power transistor and, during turn off of the power transistor, to sink a gate drive current from the control node of the power transistor. The first and second secondary current sources adjust the gate drive current to control the voltage or current rate of change and thereby the overshoot during the switching transient.

42 Claims, 8 Drawing Sheets

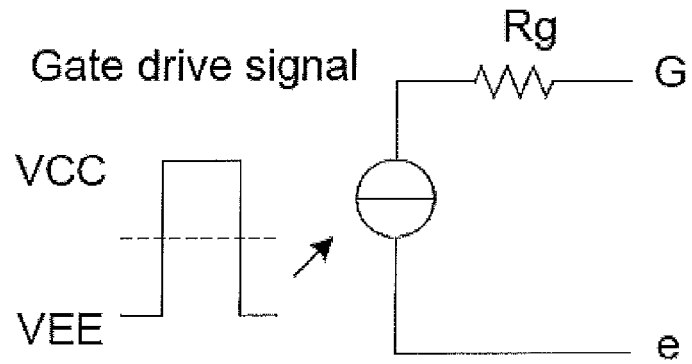
FIG. 2
Prior Art
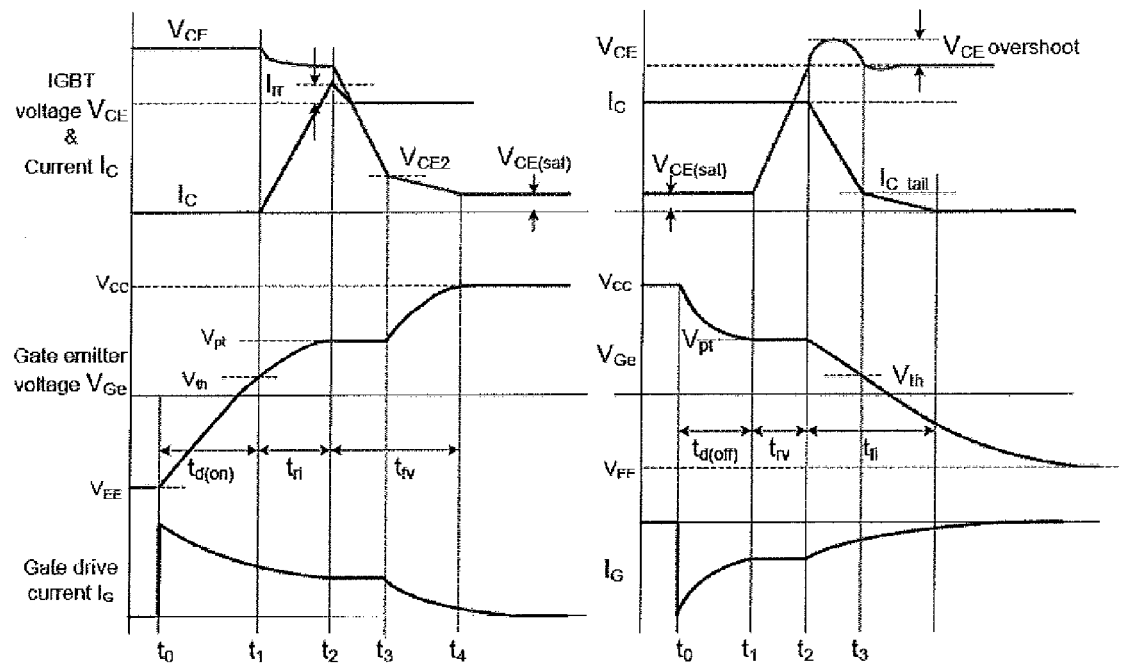
FIG. 3A
Prior Art
FIG. 3B
Prior Art

HIGH EFFICIENCY GATE DRIVE CIRCUIT FOR POWER TRANSISTORS

CROSS-REFERENCE TO RELATED APPLICATIONS

This application is a U.S. National Phase Application under 35 U.S.C. 371 of International Application No. PCT/US2013/030134 filed on Mar. 11, 2013 and published as WO 2013/138219 on Sep. 19, 2013. This application claims the benefit of U.S. Provisional Application No. 61/609,393, filed on Mar. 12, 2012. The entire disclosures of the above applications are incorporated herein by reference.

FIELD

The present disclosure relates to an improved gate drive circuit for power transistors.

BACKGROUND

Conventional voltage controlled power devices, such as IGBT or MOSFET, have been widely adopted in many power electronics equipment, such as motor drivers, inverters and switching mode power supplies. The reliability and performance of the power device is also heavily related on its gate driver circuit.

FIG. 1 illustrates an exemplary switch leg circuit with two IGBT devices (Q1 and Q2), which is a very popular structure adopted in many industry applications, such as motor drivers and inverters. In real application, the IGBT switch leg and DC input usually has some parasitic inductance Ls as indicated in FIG. 1. It may cause severe voltage overshoot across the switch during switching transient.

A conventional gate driver circuit is shown in FIG. 2. The gate drive signal is a pulse signal with required amplitude to drive the device. When the gate drive signal changes from VEE (negative amplitude) to VCC (positive amplitude), the device turns on; when the gate drive signal changes from VCC to VEE, the device turns off. Generally, VCC is around 12 to 18V and VEE is around 0V to −15V. The gate drive signal is applied to the gate emitter terminal of the device through the gate resistor Rg. The gate resistor is used to control the device (IGBT) switching behavior during switching transient, such as voltage/current change rate. IGBT turn on and turn off waveforms for an inductive load condition are shown in FIGS. 3A and 3B. Generally, the smaller the gate resistance, the faster the switching transient will be. In an inductive load condition, the load can be treated as a constant current source.

With continued to reference to FIGS. 1 and 3, the turn-on and turn off behavior of switch Q2 is further described although a similar explanation would apply to the behavior of switch Q1. Firstly, the turn on of the switch device is described. Before switch Q2 turns on, the load current freewheels through the internal diode D1 paralleled to switch Q1. At t0, the gate drive signal for switch Q2 changes from VEE to VCC to turn on switch Q2. The gate current is large at the beginning of turn on procedure but it decreases quickly as the voltage across resistor Rg decreases when $V_{Ge}$ increases as shown in FIG. 3A. The current rising rate during [t1–t2] is depended by the gate current in this period (i.e., gate resistance). If the gate resistance is small, the current change rate is fast, which leads to a severe reverse recovery current of diode D1. There is a big current overshoot in the current through switch Q2. Also, excessive energy will be stored to the parasitic inductance existing in circuit, which will result in very high voltage overshoot across Q1/D1. Furthermore, the high reverse recovery current may lead to high EMI noise in the circuit. Therefore, it is necessary to limit this voltage overshoot and reverse recovery current. For the conventional gate drive, the only possible way to increase the gate resistance is to reduce the gate current. But the gate resistance affects the whole switching period. Thus, the turn on delay time $t_{d(on)}$ and voltage falling time $t_{fv}$ will increase a lot too, which leads to high switching loss.

For turn off, at t0, the gate drive signal changes from VCC to VEE and switch Q2 starts to turn off. Similar to the turn on, the gate current decreases quickly when the gate voltage decreasing. The current fall rate during [t2–t3] will also induce a high voltage overshoot across switch Q2, which may cause device overvoltage and breakdown. It is necessary to limit this overvoltage for reliable operation. For the conventional gate driver, this can only be achieved by using a high value gate resistance, which also causes high switching loss since all the switching period is slowed. Therefore, how to effectively control the voltage/current overshoot while keeping the switching loss small is still a challenge for the gate driver circuit.

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

An improved gate drive circuit is provided for a power device, such as a transistor. The gate driver circuit includes: a current control circuit; a first secondary current source that is used to control the switching transient during turn off of the power transistor and a second secondary current source that is used to control the switching transient during turn on of the power transistor. In operation, the current control circuit operates, during turn on of the power transistor, to source a gate drive current to a control node of the power transistor and, during turn off of the power transistor, to sink a gate drive current from the control node of the power transistor. The first and second secondary current sources adjust the gate drive current to control the voltage or current rate of change and thereby the overshoot during the switching transient.

In one aspect of the disclosure, the first secondary current source is operable, during turn off of the power transistor, to adjust the gate drive current before a gate voltage of the power transistor reaches a steady state condition and is nonoperable, during turn off of the power transistor, after the gate voltage reaches a steady state condition. Likewise, the second secondary current source is operable, during turn on of the power transistor, to adjust the gate drive current before the gate voltage reaches a steady state condition and is nonoperable, during turn on of the power transistor, after the gate voltage reaches a steady state condition.

In another aspect of the disclosure, the first secondary current source is configured to receive a first control signal and adjust the gate drive current, during turn off of the power transistor, in accordance with the first control signal, such that the first control signal is indicative of a rate of change of current passing through the power transistor. Similarly, the second secondary current source is configured to receive a second control signal and adjust the gate drive current, during turn on of the power transistor, in accordance with the second control signal, the second control signal being indicative of a rate of change of current passing through the power transistor. More specifically, the first and second secondary current sources operate to adjust the gate drive current inversely proportional to the rate of change of current passing through the power transistor.

In yet another aspect of the disclosure, the first and second secondary current sources adjust the gate drive current in accordance with the rate of change of voltage at a collector node of the power transistor in addition to or in lieu of the current change rate.

Further areas of applicability of the present disclosure will become apparent from the detailed description provided hereinafter. It should be understood that the detailed description and specific examples are intended for purposes of illustration only and are not intended to limit the scope of the disclosure.

BRIEF DESCRIPTION OF THE DRAWINGS

FIG. 2 is a schematic of a conventional gate drive circuit;

FIGS. 3A and 3B are graphs illustrating switching transient waveforms for the typical switching leg circuit with a conventional gate driver circuit during turn on and turn off, respectively;

FIG. 5 is a graph illustrating switching transient waveforms for the typical switching leg circuit with the proposed active gate driver circuit during turn on;

Figure 1:
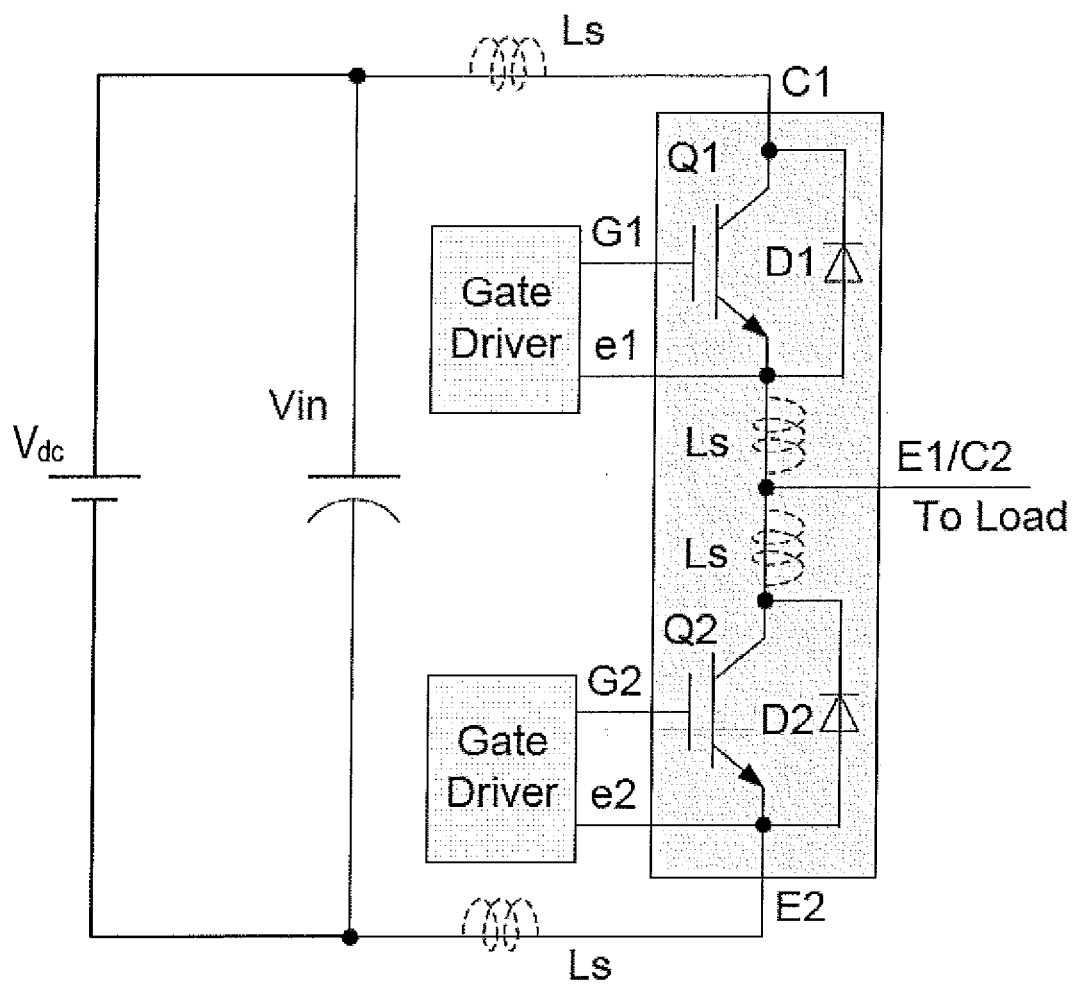
FIG. 1 is a schematic of a typical switching leg circuit with parasitic inductance.

The drawings described herein are for illustrative purposes only of selected embodiments and not all possible implementations, and are not intended to limit the scope of the present disclosure. Corresponding reference numerals indicate corresponding parts throughout the several views of the drawings.

DETAILED DESCRIPTION

Figure 4:
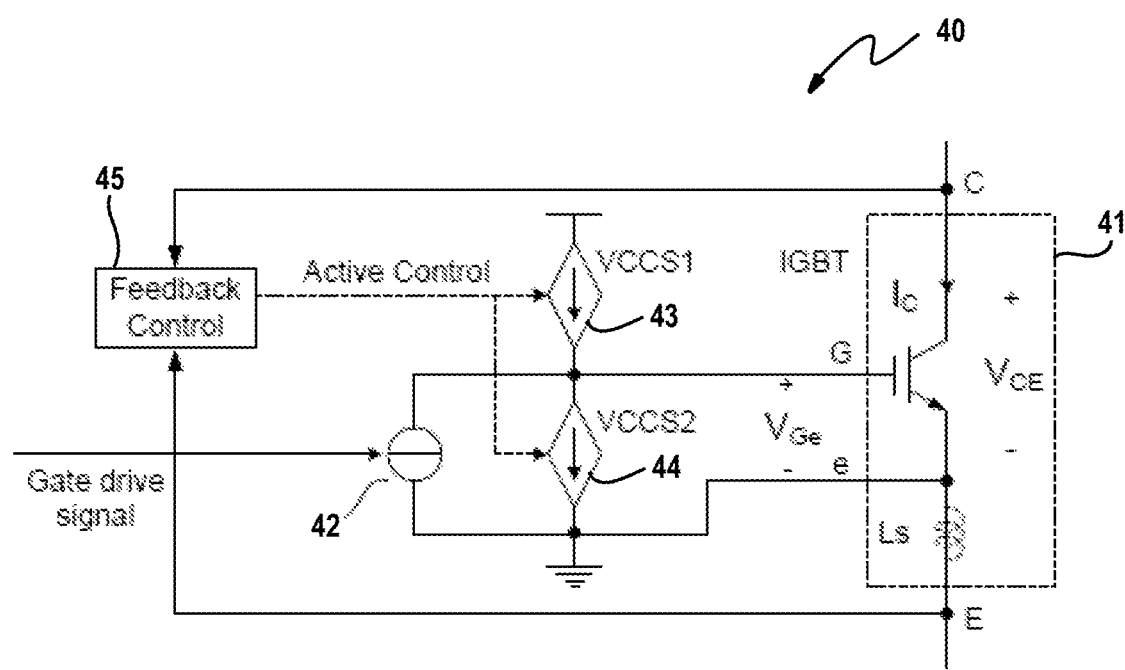
FIG. 4 is a schematic of a proposed active gate driver circuit in accordance with the disclosure.

FIG. 4 depicts an exemplary gate drive circuit 40 in accordance with this disclosure. The gate drive circuit 40 is comprised of a power transistor 41, a current control circuit 42, a first secondary current source 43 and a second secondary current source 44. The gate drive circuit 40 further includes a feedback control mechanism 45 for controlling the first and second secondary current sources 43, 44 as will be further described below. In the exemplary embodiment, the power transistor is an insulated gate bipolar transistor (IGBT). While reference is provided to an IGBT, it is readily understood that the proposed gate drive circuit 40 may be used to control a power MOSFET in place of the IGBT or extended to control other types of power devices.

The current control circuit 42 is controlled by a gate drive signal. In most applications, the gate drive signal is a PWM signal, the high level is used to turn on the device and the low level is used to turn off the device. More specifically, the current control circuit operates, during turn on of the power transistor, to source a gate drive current to a control node of the power transistor and, during turn off of the power transistor, to sink a gate drive current from the control node of the power transistor.

In the exemplary embodiment, the first and second secondary current sources 43, 44 are implemented as voltage controlled current sources (VCCS) shown in FIG. 4. During operation, the first and second secondary current sources 43, 44 are used to adjust the gate drive current at the control node of the power device. More specifically, the first and second secondary current sources 43, 44 control the voltage/ current change rate and the overshoot during the switching transient. The second secondary current source 44 is used to control the switching transient during turn-on; whereas, the first secondary current source 43 is used to control the turn-off transient. The amplitude of the active control signal for two VCCS is derived from a feedback signal of the device. The feedback signal can be sensed di/dt and/or dv/dt signal during switching transient, which has perfectly matched time sequence to control the di/dt or dv/dt during the switching transient.

Figure 5:
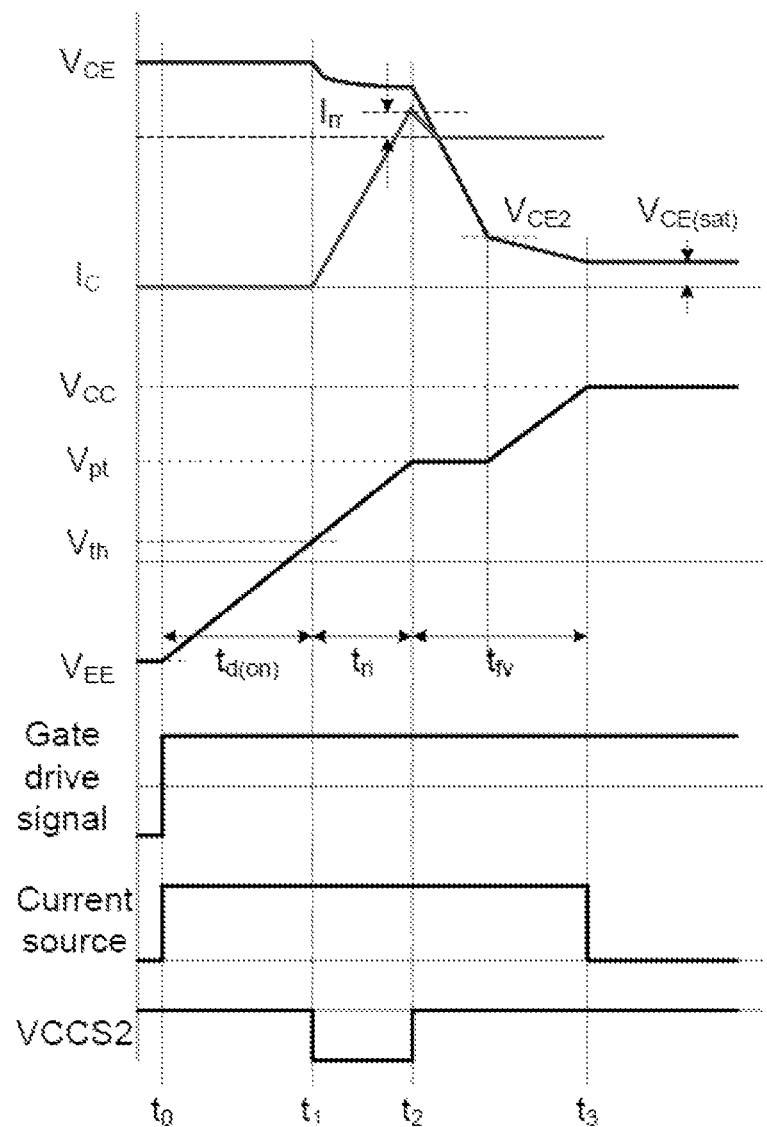

With reference to FIG. 5, the operating principle of the proposed gate driver circuit 40 is further described during turn on of the power transistor 41. In FIG. 5, theoretical waveforms are shown without considering the parasitic parameters in the gate drive circuit. Although the shapes of the waveforms are portrayed accurately, the magnitudes of the waveforms are not to scale in comparison to FIG. 3A.

During IGBT turn-on, the gate drive signal turns on the current control circuit 42 to charge up the gate voltage of the IGBT. The current control circuit 42 in turn supplies a current (referred to herein as "gate drive current") to the control node of the power transistor 41. Once the gate voltage reaches its steady state value (i.e., VCC as positive amplitude and VEE as negative amplitude), the gate drive current is cut off and the gate voltage remains at its steady state value. Though the current source has a constant value as shown in FIG. 5, its amplitude can also be changed during the turn on period.

Figure 6:
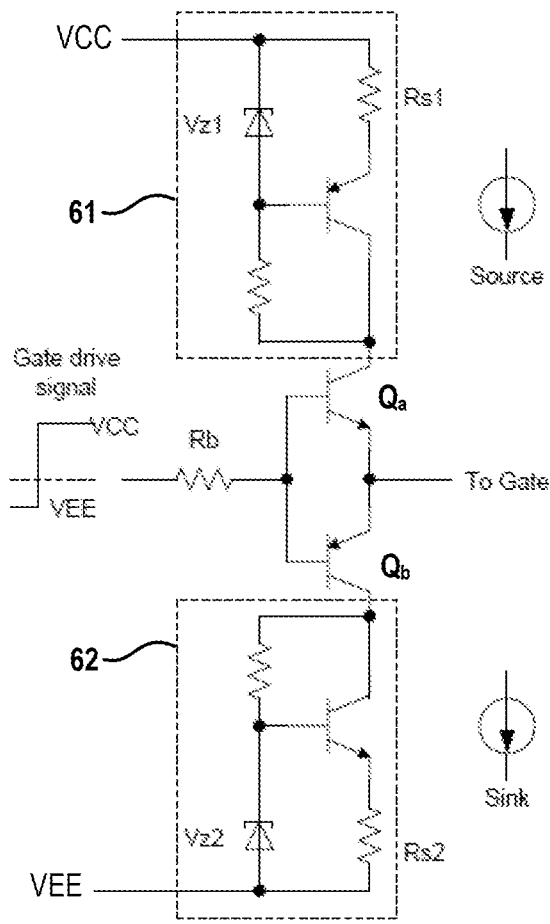
FIG. 6 is a schematic of an exemplary current source employed by the proposed gate driver circuit.

FIG. 6 depicts an exemplary embodiment for the current control circuit 42. The current control circuit 42 is comprised generally of a current source 61 coupled via a switch Qa to the control node of the power transistor 41 and a current sink 62 coupled via a switch Qb to the control node of the power transistor. In the exemplary embodiment, the current source 61 as well as the current sink 62 are implemented by a zener diode, a resistor and a transistor as shown. Other implementations for the current control circuit 42 are contemplated by this disclosure.

When the gate drive signal changes to high level (VCC), the current source 61 charges the gate capacitor through switch Qa. As soon as the gate voltage reaches the steady state value VCC, Qa turns off and the current source 61 is cut off. The gate voltage keeps its steady state value. The amplitude of the current source 61 can be constant or quasi-constant. Of note, the current source 61 has sufficient amplitude to reduce the turn on delay $t_{d(on)}$ and voltage decreasing time $t_{fv}$ to reduce the switching loss. Compared to a conventional gate driver, the current source 61 can almost keep the same amplitude and does not decrease very quickly as in the case of the conventional gate driver.

Once the gate voltage $V_{Ge}$ reaches a threshold value at t1 shown in FIG. 5, the current passing through the power transistor ($I_c$) begins to increase. During this current rising period, the current rising slew rate is dependent on the gate drive current. As mentioned above, the current source 61 has sufficient amplitude to reduce the delay time and voltage decreasing time to reduce the switching loss. Also, the rate of change of the current (di/dt) passing through the power transistor 41 is related to the gate drive current. Too high gate drive current will result in very high di/dt, which may cause high reverse recovery current and over-voltage in the opposite switch (e.g., Q1 shown in FIG. 1 when Q2 turns on). Therefore, during the current rising period, it is preferred to control the current change rate.

Figure 7:
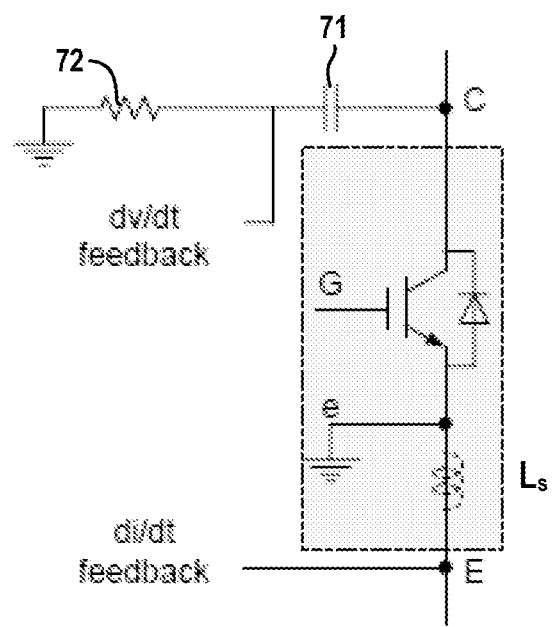
FIG. 7 is a schematic illustrating exemplary techniques for detecting the current rate of change or the voltage rate of change related to the power transistor.

FIG. 7 illustrates exemplary techniques for detecting the current rate of change or the voltage rate of change related to the power transistor 41. In an exemplary embodiment, the current change rate can be sensed by the power device's internal package or circuit parasitic inductance Ls. Additionally or alternatively, a small capacitor 71 and resistor 72 can be used to detect the voltage change rate. Other detection techniques are also contemplated by this disclosure.

During turn on of the power transistor 41, the second secondary current source 44 is used to regulate the net gate current. During the current rising period (between $t_1$ and $t_2$), the secondary current source 44 operates to adjust the gate driver current in accordance with either the current change rate, the voltage change rate or a combination thereof.

Figure 8:
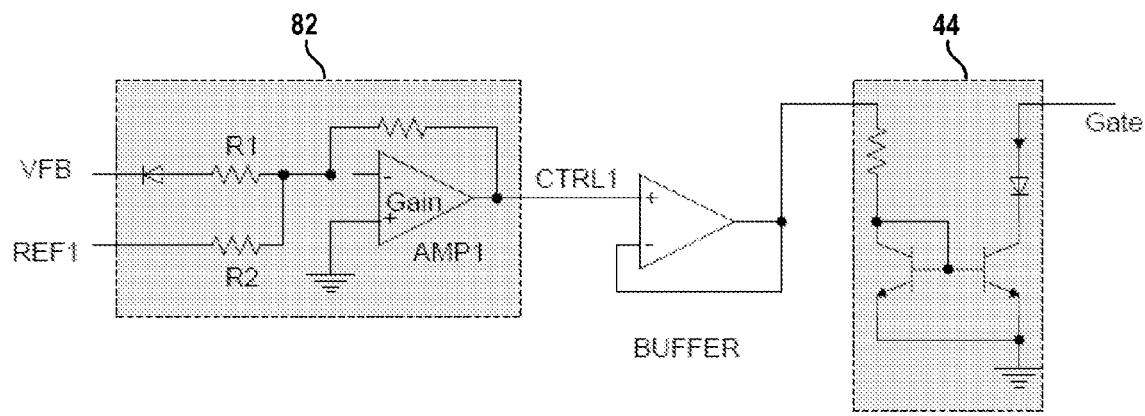
FIG. 8 is a schematic depicting an exemplary feedback control circuit for use in the proposed gate driver circuit.

FIG. 8 depicts an exemplary embodiment of a feedback control circuit 82 interfaced with the second secondary current source 44. In the exemplary embodiment, the first feedback control circuit 82 is configured to receive a feedback signal VFB and operable to generate a control signal for the second secondary current source 44, where the feedback signal VFB is the voltage signal across the parasitic inductance $V_{Ee}$. The second secondary current source 44 is implemented as a simple current mirror. Other implementations for the feedback control circuit as well as the secondary current source fall within the broader aspects of this disclosure.

In operation, the feedback signal VFB is compared to a reference signal REF1 and any error between the signals is amplified by an operational amplifier AMP1, thereby generating the control signal CTRL1. If the current slew rate is too large, CTRL1 is high and the second secondary current source 44 will draw more gate drive current away from the gate of the power transistor 41. As a result, the net gate drive current will be reduced and the current slew rate will be decreased. On the other hand, if the current slew rate is too small, CTRL1 is low and the second secondary current source 44 will draw less gate drive current away from the gate of the power transistor 41. Thus, the gate drive current is adjusted inversely proportional to the rate of change of current passing through the power transistor. This negative feedback will control the current slew rate to the desired value set by the reference signal REF1. It is envisioned that the reference signal may be set based on the load condition. For example, if the load current is high and/or the dc link voltage is high, the reference signal is set at a relatively low level to reduce the voltage spike on IGBT. Conversely, if the load current is low and/or the dc link voltage is low, where voltage spike issue is not so severe, the reference signal is set at a relatively high level to minimize the switching loss. Two exemplary embodiments are further discussed below in relation to FIGS. 13 and 14.

When current rising period is completed, the second secondary current source 44 is disabled automatically. That is, the transistor current ($I_c$) reaches a steady state value, thereby discontinuing the feedback control signal. As a result, the secondary current source ceases to adjust the gate drive current. It is noted that the normal operation of the power transistor 41 after switching is not otherwise affected.

In sum, the gate driver current can be adjusted by the second secondary current source 44 during different periods of the switching transient, which means the switching behavior can be optimized. In particular, the current/voltage overshoot can be reduced as well as the switching loss.

Figure 13:
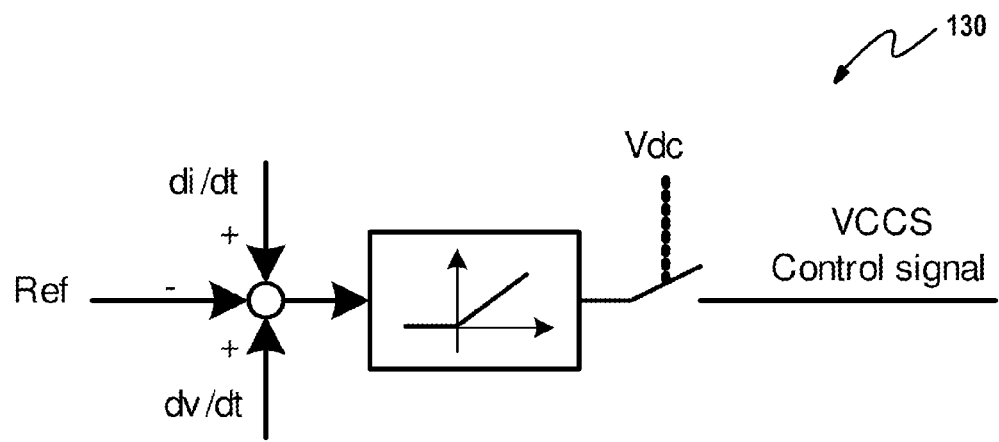
FIG. 13 is a schematic of another exemplary feedback control circuit.

FIG. 13 depicts another exemplary feedback control circuit 130 which may be used in the context of the proposed gate driver circuit 40. Feedbacks of di/dt and dv/dt less than an offset is used as the VCCS control signal if it is positive. The control circuit includes a switch 130 to shut the feedback control according to Vdc. If Vdc is less than a threshold, no control is necessary because voltage spike does not exceed the destructive level. The block between the summation and the switch guarantees only positive values are used for control; negative values are ignored.

In a variant of the feedback control circuit 130, Vdc can be replaced by load current. If the load current is high, the switch is on to reduce the current slew rate so that the current peak is suppressed. If the load current is low, the switch is off to make full use of fast switching to reduce the loss.

Figure 14:
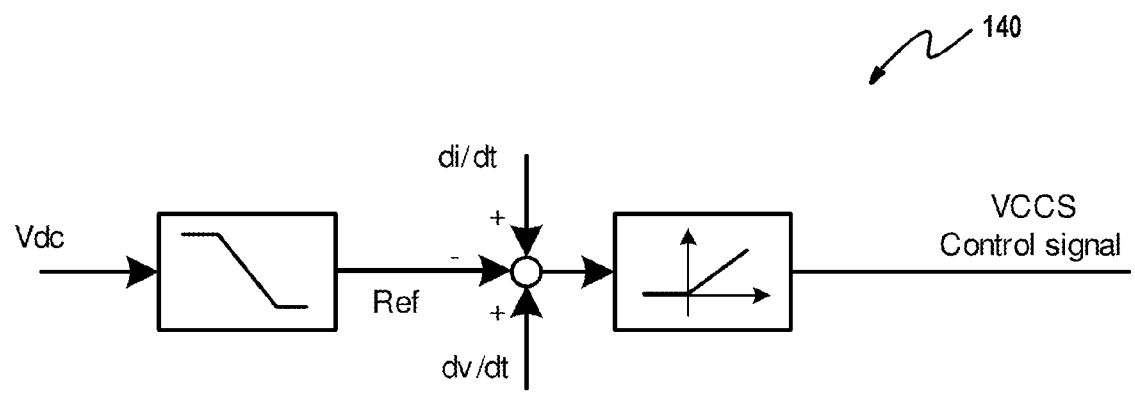
FIG. 14 is a schematic of yet another exemplary feedback control circuit.

FIG. 14 depicts yet another exemplary feedback control circuit 140. In this example, the reference value is adjusted continuously according to Vdc, thereby achieving more smooth control. Likewise, Vdc can also be replaced by load current in a variant of the feedback control circuit 140. If the load current is high, the reference is set at a low level to reduce the current slew rate so that the current peak is suppressed. If the load current is low, the reference can be high to reduce the switching loss.

Each of these different embodiments of the feedback control circuit can be applied at both turn-on and turn-off of the IGBT. Moreover, different embodiment can also be used in combination. For example, the reference value in feedback control circuit 140 may be adjusted continuously according to load current during turn-on but adjusted according to Vdc during turn-off. Also it is possible to consider both Vdc and load current at the same time to decide the references at turn-on and/or turn-off, if peak values of both current and voltage are critical. Selection of strategy and threshold or control table can be obtained by experiments and analyses. Other types of feedback control circuit also fall within the broader aspects of this disclosure.

The feedback control mechanism 45 can also be used to control the rate of change of the voltage. In this case, the feedback signal VFB is the voltage at the collector node of the power transistor 41; otherwise, operation of the feedback control mechanism 45 is the same as described above in relation to control the current change rate. It is also envisioned control can be based upon a combination of the two feedback voltage measures.

Figure 9:
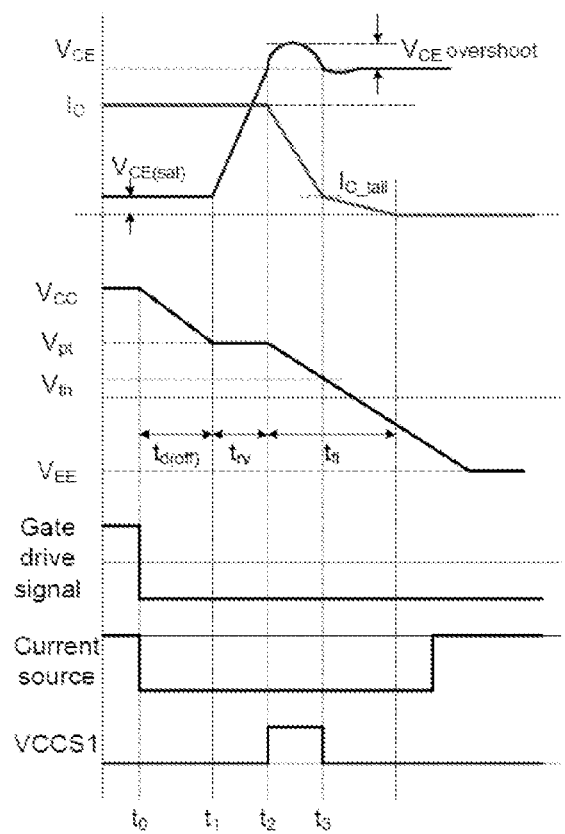
FIG. 9 is a graph illustrating switching transient waveforms for the typical switching leg circuit with the proposed active gate driver circuit during turn off.

With reference to FIG. 9, the operating principle of the proposed gate driver circuit 40 is also described during turn off of the power transistor 41. IGBT turn off is similar to that for turn on. Again, the shapes of the waveforms are portrayed accurately while the magnitudes of the waveforms are not to scale in comparison to FIG. 3B. At t0, the gate drive signal turns off the power device 41, the current source (sink) 62 shown in FIG. 6 is activated to discharge gate voltage through switch Qb. Once the gate voltage reaches its steady state value VEE, Qb turns off and the current sink 62 is cut off. The gate voltage keeps its steady state value. The current sink 62 can be implemented by other circuits. The amplitude of the current can be constant or quasi-constant. Of note, the current sink 62 has sufficient amplitude to reduce the turn on delay $t_{d(off)}$ and voltage rising time $t_{rv}$ to reduce the switching loss. Compared to conventional gate drive, the current sink 62 can almost keep the same amplitude and does not decrease very quickly as compared to the conventional gate driver.

Once the collector voltage $V_{CE}$ reaches the input voltage at t2 shown in FIG. 9, the current passing through the power transistor begins to decrease. During this current decreasing period, the current slew rate is depended on the gate drive current. As mentioned above, the current source has sufficient amplitude to reduce the delay time and voltage rising time to reduce the switching loss. Also, the current change rate di/dt is related to the gate drive current. Too high gate drive current will result in very high di/dt, which may cause high voltage overshoot of the device due to the induced voltage across the parasitic inductance inevitably existing in the circuit. Therefore, during the current decreasing period, it is preferred to control the current change rate.

During turn off of the power transistor 41, the first secondary current source 43 is used to regulate the net gate current. During the current falling period (between $t_2$ and $t_3$), the first secondary current source 43 operates to adjust the gate driver current in accordance with either the current change rate, the voltage change rate or a combination thereof.

Figure 10:
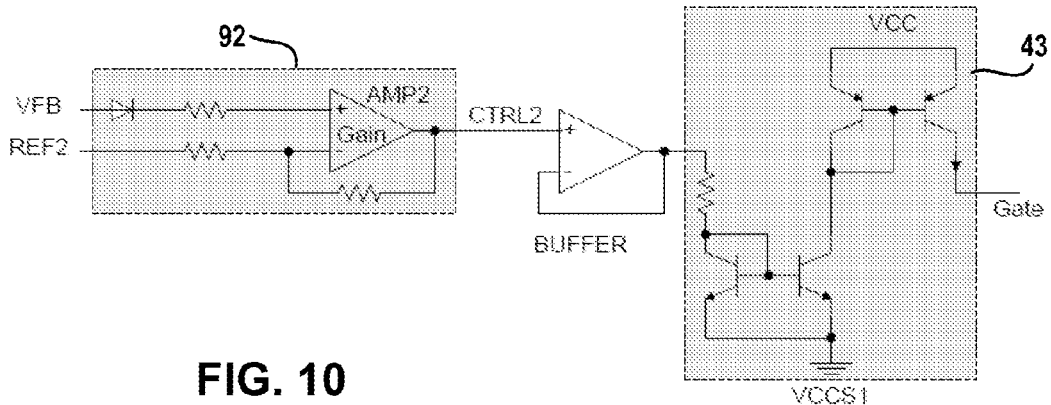
FIG. 10 is a schematic depicting another exemplary feedback control circuit for use in the proposed gate driver circuit.

FIG. 10 depicts an exemplary embodiment of a feedback control circuit 92 interface with the first secondary current source 43. In the exemplary embodiment, the feedback control circuit 92 is configured to receive a feedback signal VFB and operable to generate a control signal for the first secondary current source 43, where the feedback signal VFB is the voltage signal across the parasitic inductance $V_{Ee}$ as shown in FIG. 7. The first secondary current source 44 is implemented as a simple current mirror. Other implementations for the feedback control circuit also fall within the broader aspects of this disclosure.

In operation, the feedback signal VFB is compared to a reference signal REF2 using an operational amplifier AMP2. Any error between the signals is amplified and output as the control signal CTRL 2 to the first secondary current source 43. If the slew rate is too large, the control signal CTRL2 is large too, which in turn forces the first secondary current source 43 to inject a high current to gate to reduce the net discharged gate current. Therefore, the current change rate is reduced. On the other hand, if the current slew rate is too small, the control signal CTRL2 is low and the first secondary current source 43 will adjust the gate drive current to increase the net discharge gate current and thereby increase the current change rate. Thus, the gate drive current is adjusted inversely proportional to the rate of change of current passing through the power transistor.

When this period is finished, the first secondary current source 43 is disabled automatically. That is, the transistor current ($I_c$) reaches a steady state value after $t_3$, thereby discontinuing the feedback control signal. As a result, the first secondary current source 43 ceases to adjust the gate drive current. It is noted that the normal operation of the power transistor 41 after switching is not otherwise affected.

Figure 11:
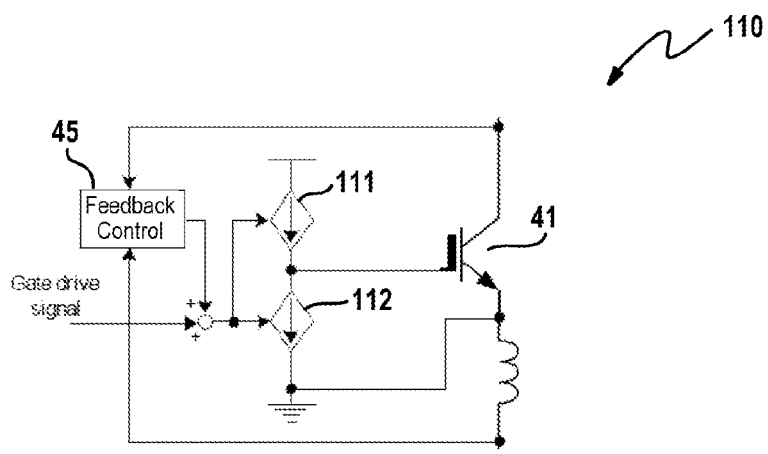
FIG. 11 a schematic of a second proposed active gate driver circuit in accordance with the disclosure.

FIG. 11 depicts a second exemplary embodiment for an active gate drive circuit 110 in accordance with this disclosure. The gate drive circuit 110 is comprised of a power transistor 41, a first and second voltage controlled current source 111, 112, and a feedback control mechanism 45 for controlling the first and second voltage controlled current sources 111, 112. In this embodiment, a constant current source is integrated into each of the two voltage controller current sources 111, 112 and the gate drive signal input directly into each of the two voltage controller current sources 111, 112; otherwise, this embodiment operates in the manner set forth above in relation to gate drive circuit 40.

Figure 12:
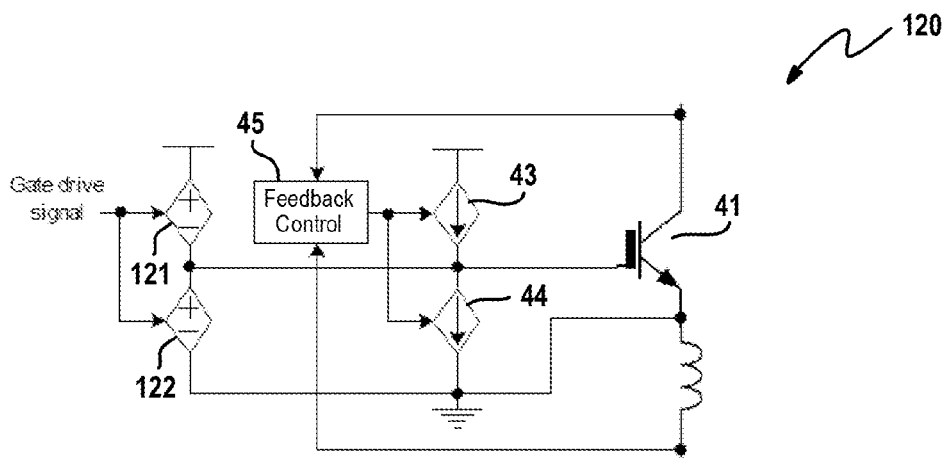
FIG. 12 is a schematic of a third proposed active gate driver circuit in accordance with the disclosure.

FIG. 12 depicts a third exemplary embodiment for an active gate drive circuit 120 in accordance with this disclosure. The gate drive circuit 120 is comprised of a power transistor 41, a first and second voltage source 121, 122, a first and second voltage controlled current source 43, 44, and a feedback control mechanism 45 for controlling the first and second voltage controlled current sources 43, 44. In this embodiment, the first and second voltage source 121, 122 replace the constant current source. It is noted that there is no resistance or a small resistance between the first and second voltage sources 121, 122 and the gate of the transistor 41. In this way, the gate drive current can be maximized to reduce current rising (or falling) period; otherwise, this embodiment operates in the manner set forth above in relation to gate drive circuit 40.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. For purposes of clarity, the same reference numbers will be used in the drawings to identify similar elements. As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

What is claimed is:

1. A gate drive circuit for a power transistor, comprising:
a power transistor having a control node;
a current control circuit operable, during turn on of the power transistor, to source a gate drive current to a control node of the power transistor and, during turn off of the power transistor, to sink a gate drive current from the control node of the power transistor;
a first secondary current source distinct from the current control circuit and coupled directly to the control node, the first secondary current source is configured to receive a first control signal and adjust the gate drive current, during turn off of the power transistor, in accordance with the first control signal, the first control signal being indicative of a rate of change of current passing through the power transistor; and
a second secondary current source distinct from the current control circuit and coupled directly to the control node, the second secondary current source is configured to receive a second control signal and adjust the gate drive current, during turn on of the power transistor, in accordance with the second control signal, the second control signal being indicative of a rate of change of current passing through the power transistor.

2. The gate drive circuit of claim 1 further comprises
a first feedback control circuit configured to receive a feedback signal measured at an emitter of the power transistor and operable to generate the first control signal; and
a second feedback control circuit configured to receive the feedback signal and operable to generate the second control signal.

3. The gate drive circuit of claim 1 wherein the first secondary current source is operable, during turn off of the power transistor, to adjust the gate drive current before a gate voltage of the power transistor reaches a steady state condition and is nonoperable, during turn off of the power transistor, after the gate voltage reaches a steady state condition.

4. The gate drive circuit of claim 1 wherein the second secondary current source is operable, during turn on of the power transistor, to adjust the gate drive current before the gate voltage reaches a steady state condition and is nonoperable, during turn on of the power transistor, after the gate voltage reaches a steady state condition.

5. The gate driver circuit of claim 1 wherein the power transistor is further defined as an insulated gate bipolar transistor.

6. The gate driver circuit of claim 1 wherein the current control circuit includes a current source electrically coupled via a source switch to the control node of the power transistor and a current sink electrically coupled via a sink switch to the control node of the power transistor, such that the source switch and sink switch are controlled by a gate drive signal.

7. The gate drive circuit of claim 1 wherein the first secondary current source is implemented as a current mirror and the second secondary current source is implemented as a current mirror.

8. The gate drive circuit of claim 1 further comprises a feedback control circuit wherein the feedback control circuit generates a control signal, in accordance with a reference signal, for at least one of the first secondary current source and the second secondary current source and the reference signal is adjusted according to a load connected to the power transistor.

9. A gate drive circuit for a power transistor, comprising:
a power transistor having a control node;
a current control circuit operable, during turn on of the power transistor, to source a gate drive current to a control node of the power transistor and, during turn off of the power transistor, to sink a gate drive current from the control node of the power transistor;
a first secondary current source distinct from the current control circuit and coupled directly to the control node, the first secondary current source is configured to receive a first control signal and adjust the gate drive current, during turn off of the power transistor, in accordance with the first control signal, the first control signal being indicative of a rate of change of voltage at a collector node of the power transistor; and
a second secondary current source distinct from the current control circuit and coupled directly to the control node, the second secondary current source is configured to receive a second control signal and adjust the gate drive current, during turn on of the power transistor, in accordance with the second control signal, the second control signal being indicative of a rate of change of current passing through the power transistor.

10. The gate drive circuit of claim 9 further comprises
a first feedback control circuit configured to receive a feedback signal measured at an emitter of the power transistor and operable to generate the first control signal; and
a second feedback control circuit configured to receive the feedback signal and operable to generate the second control signal.

11. The gate drive circuit of claim 9 wherein the first secondary current source is operable, during turn off of the power transistor, to adjust the gate drive current before a gate voltage of the power transistor reaches a steady state condition and is nonoperable, during turn off of the power transistor, after the gate voltage reaches a steady state condition.

12. The gate drive circuit of claim 9 wherein the second secondary current source is operable, during turn on of the power transistor, to adjust the gate drive current before the gate voltage reaches a steady state condition and is nonoperable, during turn on of the power transistor, after the gate voltage reaches a steady state condition.

13. The gate driver circuit of claim 9 wherein the power transistor is further defined as an insulated gate bipolar transistor.

14. The gate driver circuit of claim 9 wherein the current control circuit includes a current source electrically coupled via a source switch to the control node of the power transistor and a current sink electrically coupled via a sink switch to the control node of the power transistor, such that the source switch and sink switch are controlled by a gate drive signal.

15. The gate drive circuit of claim 9 wherein the first secondary current source is implemented as a current mirror and the second secondary current source is implemented as a current mirror.

16. The gate drive circuit of claim 9 further comprises a feedback control circuit wherein the feedback control circuit generates a control signal, in accordance with a reference signal, for at least one of the first secondary current source and the second secondary current source and the reference signal is adjusted according to a load connected to the power transistor.

17. A gate drive circuit for a power transistor, comprising:
a power transistor having a control node;
a current control circuit operable, during turn on of the power transistor, to source a gate drive current to a control node of the power transistor and, during turn off of the power transistor, to sink a gate drive current from the control node of the power transistor;
a first secondary current source distinct from the current control circuit and coupled directly to the control node, the first secondary current source is operable, during turn off of the power transistor, to adjust the gate drive current before a gate voltage of the power transistor reaches a steady state condition and is nonoperable, during turn off of the power transistor, after the gate voltage reaches a steady state condition; and
a second secondary current source distinct from the current control circuit and coupled directly to the control node, the second secondary current source is operable, during turn on of the power transistor, to adjust the gate drive current before the gate voltage reaches a steady state condition and is nonoperable, during turn on of the power transistor, after the gate voltage reaches a steady state condition.

18. The gate drive circuit of claim 17 wherein the first secondary current source operates to adjust the gate drive current in accordance with a rate of change of current passing through the power transistor during turn off of the power transistor; and the second secondary current source operates to adjust the gate drive current in accordance with a rate of change of current passing through the power transistor during turn on of the power transistor.

19. The gate drive circuit of claim 17 wherein the current control circuit is nonoperable, during turn off of the power transistor, after the gate voltage reaches a steady and is nonoperable, during turn on of the power transistor, after the gate voltage reaches a steady state condition state condition.

20. The gate drive circuit of claim 17 wherein the first secondary current source is nonoperable during turn on of the power transistor and second secondary current source is nonoperable during turn off of the power transistor.

21. The gate driver circuit of claim 17 wherein the power transistor is further defined as an insulated gate bipolar transistor.

22. The gate driver circuit of claim 17 wherein the current control circuit includes a current source electrically coupled via a source switch to the control node of the power transistor and a current sink electrically coupled via a sink switch to the control node of the power transistor, such that the source switch and sink switch are controlled by a gate drive signal.

23. The gate drive circuit of claim 17 wherein the first secondary current source is implemented as a current mirror and the second secondary current source is implemented as a current mirror.

24. The gate drive circuit of claim 17 wherein the first secondary current source operates to adjust the gate drive current in accordance with a rate of change of voltage at a collector node of the power transistor during turn off of the power transistor; and the second secondary current source operates to adjust the gate drive current in accordance with a rate of voltage at a collector node of the power transistor during turn on of the power transistor.

25. The gate drive circuit of claim 24 further comprises a feedback control circuit configured to receive a signal indicative of the rate of change of voltage and generate a control signal for at least one of the first secondary current source and the second secondary current source.

26. The gate drive circuit of claim 17 further comprises a feedback control circuit wherein the feedback control circuit generates a control signal, in accordance with a reference signal, for at least one of the first secondary current source and the second secondary current source and the reference signal is adjusted according to a load connected to the power transistor.

27. A gate drive circuit for a power transistor, comprising:
a power transistor having a control node;
a first voltage controlled current source coupled directly to the control node and configured, during turn off of the power transistor, to sink a gate drive current from the control node of the power transistor and operable, during turn off of the power transistor, to adjust the gate drive current before a gate voltage of the power transistor reaches a steady state condition, where the first voltage controlled current source configured is nonoperable, during turn off of the power transistor, after the gate voltage reaches a steady state condition; and
a second voltage controlled current source coupled directly to the control node and configured, during turn on of the power transistor, to source a gate drive current to a control node of the power transistor and operable, during turn on of the power transistor, to adjust the gate drive current before the gate voltage reaches a steady state condition, where the second voltage controller current source is nonoperable, during turn on of the power transistor, after the gate voltage reaches a steady state condition.

28. The gate drive circuit of claim 27 wherein the first voltage controlled current source operates to adjust the gate drive current in accordance with a rate of change of current passing through the power transistor during turn off of the power transistor; and the second voltage controlled current source operates to adjust the gate drive current in accordance with a rate of change of current passing through the power transistor during turn on of the power transistor.

29. The gate drive circuit of claim 27 wherein the first voltage controlled current source is nonoperable during turn on of the power transistor and second voltage controlled current source is nonoperable during turn off of the power transistor.

30. The gate driver circuit of claim 27 wherein the power transistor is further defined as an insulated gate bipolar transistor.

31. The gate driver circuit of claim 27 wherein the first voltage controlled current source operates to adjust the gate drive current in accordance with a rate of change of voltage at a collector node of the power transistor during turn off of the power transistor; and the second voltage controlled current source operates to adjust the gate drive current in accordance with a rate of voltage at a collector node of the power transistor during turn on of the power transistor.

32. The gate drive circuit of claim 27 further comprises a feedback control circuit configured to receive a signal indicative of the rate of change of voltage and generate a control signal for at least one of the first secondary current source and the second secondary current source.

33. The gate drive circuit of claim 27 further comprises a feedback control circuit wherein the feedback control circuit generates a control signal, in accordance with a reference signal, for at least one of the first secondary current source and the second secondary current source and the reference signal is adjusted according to a load connected to the power transistor.

34. A gate drive circuit for a power transistor, comprising:
a power transistor having a control node;
a first voltage source coupled to the control node and operable, during turn off of the power transistor, to sink a gate drive current from the control node of the power transistor;
a second voltage source coupled to the control node and operable, during turn on of the power transistor, to source a gate drive current to the control node of the power transistor;
a first secondary current source coupled to the control node and operable, during turn off of the power transistor, to adjust the gate drive current before a gate voltage of the power transistor reaches a steady state condition and is nonoperable, during turn off of the power transistor, after the gate voltage reaches a steady state condition; and
a second secondary current source coupled to the control node and operable, during turn on of the power transistor, to adjust the gate drive current before the gate voltage reaches a steady state condition and is nonoperable, during turn on of the power transistor, after the gate voltage reaches a steady state condition.

35. The gate drive circuit of claim 34 wherein the first secondary current source operates to adjust the gate drive current in accordance with a rate of change of current passing through the power transistor during turn off of the power transistor; and the second secondary current source operates to adjust the gate drive current in accordance with a rate of change of current passing through the power transistor during turn on of the power transistor.

36. The gate drive circuit of claim 34 wherein the first voltage source is nonoperable, during turn off of the power transistor, after the gate voltage reaches a steady and the second voltage source is nonoperable, during turn on of the power transistor, after the gate voltage reaches a steady state condition state condition.

37. The gate drive circuit of claim 34 wherein the first secondary current source is nonoperable during turn on of the power transistor and second secondary current source is nonoperable during turn off of the power transistor.

38. The gate driver circuit of claim 34 wherein the power transistor is further defined as an insulated gate bipolar transistor.

39. The gate driver circuit of claim 34 wherein the first secondary current source is implemented as a current mirror and the second secondary current source is implemented as a current mirror.

40. The gate drive circuit of claim 34 wherein the first secondary current source operates to adjust the gate drive current in accordance with a rate of change of voltage at a collector node of the power transistor during turn off of the power transistor; and the second secondary current source operates to adjust the gate drive current in accordance with a rate of voltage at a collector node of the power transistor during turn on of the power transistor.

41. The gate drive circuit of claim 34 further comprises a feedback control circuit configured to receive a signal indicative of the rate of change of voltage and generate a control signal for at least one of the first secondary current source and the second secondary current source.

42. The gate drive circuit of claim 34 further comprises a feedback control circuit wherein the feedback control circuit generates a control signal, in accordance with a reference signal, for at least one of the first secondary current source and the second secondary current source and the reference signal is adjusted according to operating conditions.

\* \* \* \* \*